United States Patent [19]
Zaremba et al.

[11] Patent Number: 4,956,911
[45] Date of Patent: Sep. 18, 1990

[54] TOOL FOR REPAIRING SURFACE MOUNTED COMPONENTS ON PRINTED CIRCUIT BOARD

[75] Inventors: Norman S. Zaremba, St. Charles; John P. Beyer, Western Springs, both of Ill.

[73] Assignee: AG Communication Systems Corporation, Phoenix, Ariz.

[21] Appl. No.: 524,893

[22] Filed: May 18, 1990

[51] Int. Cl.$^5$ .............................................. H05K 3/30
[52] U.S. Cl. ................................ 29/721; 29/402.03; 29/740; 29/743; 29/834; 228/49.1; 228/105; 228/264
[58] Field of Search ................ 29/721, 740, 741, 743, 29/834-836, 402.03; 264/264, 49.1, 103, 105

[56] References Cited

U.S. PATENT DOCUMENTS 3,557,430 1/1971 Jones .................................. 29/833 X
4,813,518 3/1989 Srivastava et al. ............. 228/105 X

*Primary Examiner*—Carl E. Hall
*Attorney, Agent, or Firm*—Robert J. Black; Gregory G. Hendricks

[57] ABSTRACT

A tool for repairing an improperly positioned surface mounted component on the printed circuit board consisting of a body portion with a pair of legs positioned relative to the component mounting area on the printed circuit board with an included vacuum mechanism used to seize the component and reposition it against locating cams included in a pair of vertical legs.

14 Claims, 2 Drawing Sheets

TOOL FOR REPAIRING SURFACE MOUNTED COMPONENTS ON PRINTED CIRCUIT BOARD

BACKGROUND OF THE INVENTION

1. Field of the Invention

The present invention pertains to repair of printed circuit board assemblies utilizing surface mounted components and more particularly to a tool useful in the process of repairing or replacing surface mounted electronic components attached to printed circuit boards.

2. Background Art

The process of attaching or positioning surface mounted components to printed circuit boards requires a number of steps including the precision application of a solder paste to the printed circuit board pads used to mount the electronic surface mounted components. Also required is the use of hand placement or high speed automated placement of surface mounted components into the solder paste previously applied. This step is then followed by melting the solder paste via vapor phase reflow soldering, infra red reflow soldering, or similar equivalent techniques. Finally, the soldering process is followed by the cleaning, inspection and repair of the printed circuit board assembly.

Normally, prior to the reflow soldering step in the process, inspection, followed by repair and/or repositioning of the surface mounted component relative to the solder paste and pad may be required to assure a high quality, highly reliable assembly. This presolder inspection and repair process is usually accomplished utilizing manual methods. Manual methods usually include manual inspection followed by manual repositioning which requires the relying on the dexterity and accuracy of the inspector to perfect the manual reposition of the component prior to reflow soldering.

Most recently, the use of automatic inspection techniques, such as automated optical inspection, have been developed for qualifying both the solder deposition characteristics as well as the accuracy of the component placement, whether it is done manually or by automatic process. However, in either case of inspection, whether it be manual or automatic, the task of correcting defective component positioning has remained an exclusively manual task. The usual techniques required for repositioning components typically employ the use of "tweezers" or probes to push or turn the component to achieve the proper relationship, i.e., orientation, of the surface mounted component leads to the printed circuit board mounting pads. As can be expected, this process is a highly subjective one, relying on the operator perception and dexterity exclusively. It has also been found that in addition the act of pushing or turning while in contact with the solder paste can cause a so-called "snowplow" effect, forcing the solder paste to bridge to an adjacent mounting pad leading to the possibility of electrical short circuits. In addition, since the solder paste interface between the printed circuit board and the component has a certain height or thickness parameter to offset irregularities in component lead position or co-planarity and to provide sufficient solder volume to ensure a good solder joint, any disruption of this paste jeopardizes this particular requirement.

SUMMARY OF THE INVENTION

The present invention consists of a hand operated universal positioning tool utilized for repositioning improperly located surface mounted components on printed circuit boards. The tool consists of an adjustable center support section which includes two rack and pinion mounted extension sections or arms. On the end of each arm is a vertical member or leg extending in a downward direction having two wall portions at right angles to each other. Each leg assembly includes at least two cam locators which facilitate the repositioning of surface mounted components. Also included as well is an image magnification section on the top of each leg assembly. Included in the image magnification section which is transparent are also a pair of arrows in each assembly useful in proper alignment of the tool relative to the base on the printed circuit board to which the surface mounted component is to be secured. Passing through the center of the support body is a vertical spring loaded shaft which has connections to a vacuum source near one end and a vacuum cup on the other. The vacuum cup is utilized to grasp the surface mounted component to be relocated with a spring portion utilized to draw it upward in a vertical direction away from its initial or incorrect mounting position.

In the case of an automatic optical inspection system, when a component has been found to be mispositioned, the printed circuit board assembly is typically moved to a "repair" station. If a defect is discovered by manual vision inspection, then the repair process is usually handled at the same station. In any case, the repair tool in accordance with the present invention is adjusted for the surface mounted component and then positioned over the mislocated surface mounted component and down onto the printed circuit board. Once positioned, the vacuum component pickup mechanism is actuated manually. This vacuum mechanism removes the component vertically upward from the printed circuit board and then engages the component centering cams located on the legs of the tool to automatically relocate the component relative to the repair tool reference system, the component is now correctly located relative to the printed circuit board mounting pad. This is followed by reverse activation of the tool's mechanism positioning the component back on the printed circuit board in a corrected position. The vacuum is then released and the component repositioning has been accomplished.

Since all component positioning was accomplished with a vertical lift and replaced with the same motion, no solder smearing or "snowplowing" effect has occurred. Also, since the tool positioning has been held relatively constant during the entire repositioning cycle, no subjective visual dexterity errors are introduced. Finally, the image magnification built into the tool at the top of the leg portions allows an operator to precisely locate the tool relative to the component mounting pads on the printed circuit board.

DESCRIPTION OF THE PREFERRED EMBODIMENT

Figure 1:
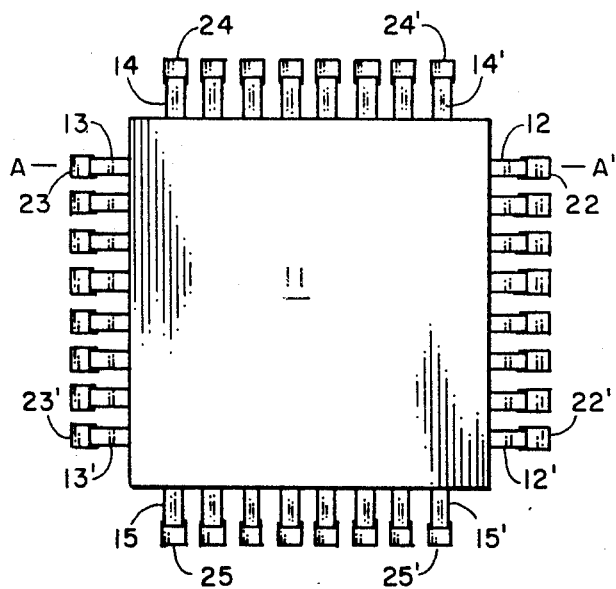
FIG. 1 is a top view of a surface mounted component showing its mounting position relative to printed circuit board mounting pads.
Figure 2:
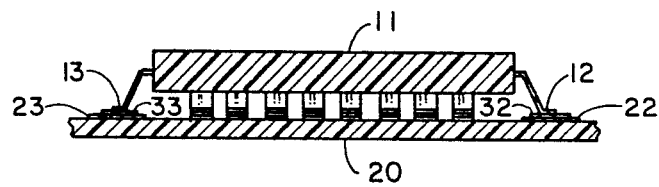
FIG. 2 is a side sectional view of a surface mounted component mounted on the printed circuit board showing the component leads, the printed circuit mounting pads and the positioning of solder paste between the component leads and the printed circuit board mounting pads.

The problem solved by the repair tool of the present invention and its method of operation can best be understood by understanding the problem for which it is intended to correct. Referring first to FIG. 1, a surface mounted component 11 is shown mounted on a printed circuit board where leads 12 through 12', 13 through 13', 14 through 14', and 15 through 15' are shown in proper location or registration over printed circuit board pads. The pads are the only portion of the printed circuit board shown. Component leads 12 through 12' are located on printed circuit board pads 22 through 22', leads 13 through 13' on pads 23 through 23', leads 14 through 14' located on pads 24 through 24' and leads 15 through 15' located on pads 25 through 25'. By reference to the sectional view shown in FIG. 2, the surface mounted component 11 is shown mounted on printed circuit board 20 with the leads 12 and 13 positioned over printed circuit board pads 22 and 23, respectively. Solder paste 32 and 33 is positioned between the component leads and the mounting pads.

From these two views it will be obvious that improper positioning either horizontally or vertically can result in the possibility of short circuits or incorrect component connection requiring repair.

Figure 3:
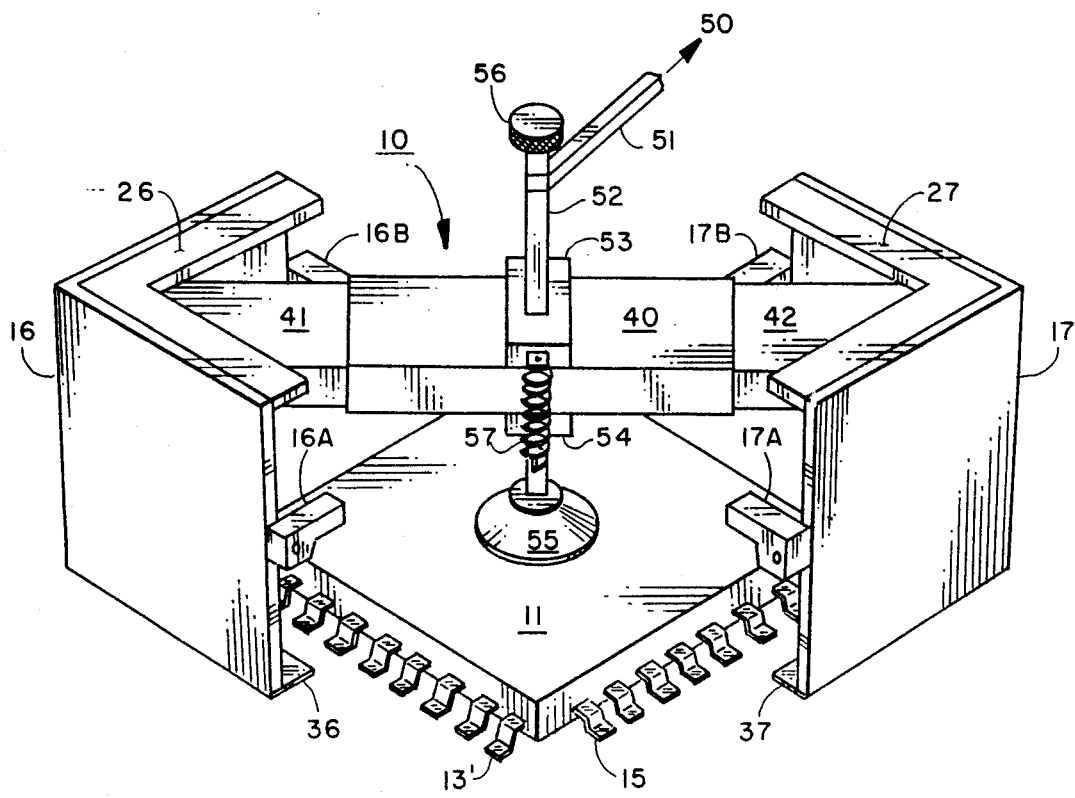
FIG. 3 is a perspective view of a surface mounted component repair tool in accordance with the present invention.

Referring now to the repair tool 10 of the present invention, as seen in FIG. 3, it will be seen the tool includes a telescoping mechanism consisting of a central portion 40, as well as telescoping ends 41 and 42. Attached to each of the end portions are vertical legs each including two walls positioned relative to each other at right angles. The two legs 16 and 17, respectively, are attached to the telescoping ends of the tool 41 and 42, respectively. On top of each leg is a transparent image magnification section such as 26 located on leg 16 and 27 located on leg 17 which as may be seen by reference to FIG. 5 also include tool positioning arrows which facilitate the proper location of the tool relative to the component to be realigned and the location on the printed circuit board to which it should be properly affixed.

Passing through the telescoping portion of the repair tool is a plunger mechanism 52 which is spring loaded by means of spring 56 and includes a portion 51 extending to a vacuum source 50. The plunger mechanism is hollow, allowing vacuum from source 50 to be conducted through 51 and through the shaft 52 to a vacuum cup 55 which is utilized in grasping a surface mounted component such as 11. Sections 53 and 54 act to position and guide the plunger mechanism 52.

Located on each of the vertical walls of the legs 16 and 17, respectively, are cam locators 16A and 16B located on leg 16 and 17A and 17B located on leg 17. These cam locators provide the actual repositioning of the surface mounted component that has been improperly aligned as will be discussed later.

Figure 4:
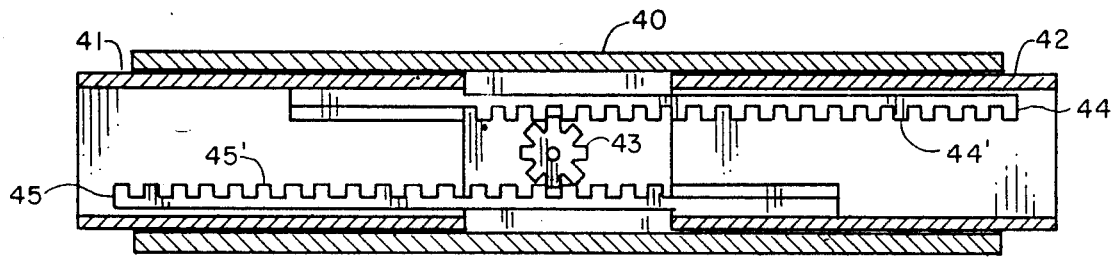
FIG. 4 is a vertical sectional view of a portion of the body of the present invention showing internal rack and pinion telescoping gears which facilitate the telescoping mechanism.

Adjustment of the repair tool to the proper size for the component to be properly centered or relocated is facilitated by the telescoping mechanism shown in detail in the cross section view of FIG. 4. It will be seen that the rack gears 44' and 45' positioned on end sections 44 and 45, respectively, engage pinion gear 43. Thus movement of either extension end section 41 or 42 will act to cause a like motion, inward or outward for adjustment purposes, of the other leg. While the gearing arrangement shown in FIG. 4 (which is a vertical section) shows only a single arrangement located on just one side of the tool adjacent to the plunger mechanism, there may be a dual format located on both sides of the plunger mechanism.

Figure 5:
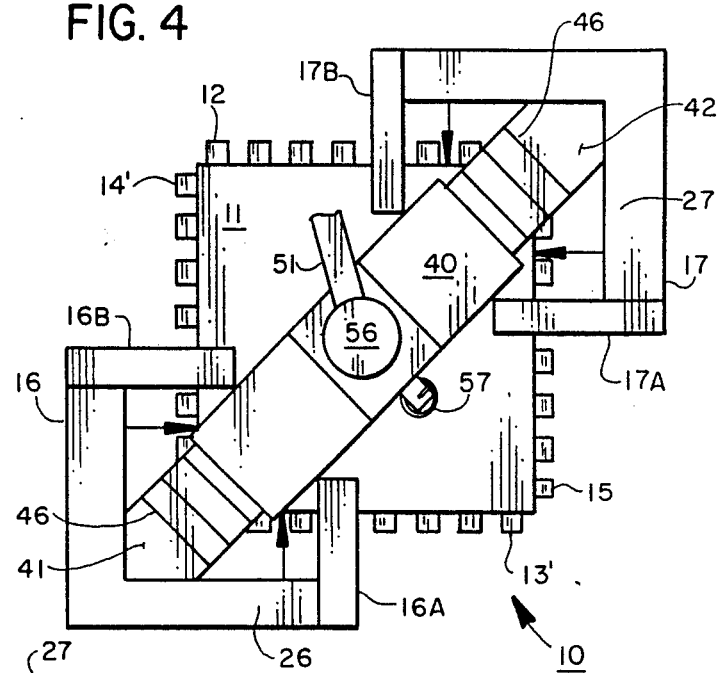
FIG. 5 is a top view showing a portion of the repair tool of the present invention showing it in proper position over a surface mounted component.

As can be seen in FIG. 5, the upper portion of each of the extension arms 41 and 42 include marks such as those shown as 46 which facilitate proper positioning of the telescoping extensions within the central portion for various surface mounted components. Positioning of the tool according to these marks presets the tool for appropriate component location. It can thus be seen by reference to FIGS. 3, 4 and 5 that by telescoping the legs 41 and 41 of the tool to the appropriate setting prior to positioning the tool on the printed circuit board no further adjustment or tool movement is required.

Figure 6:
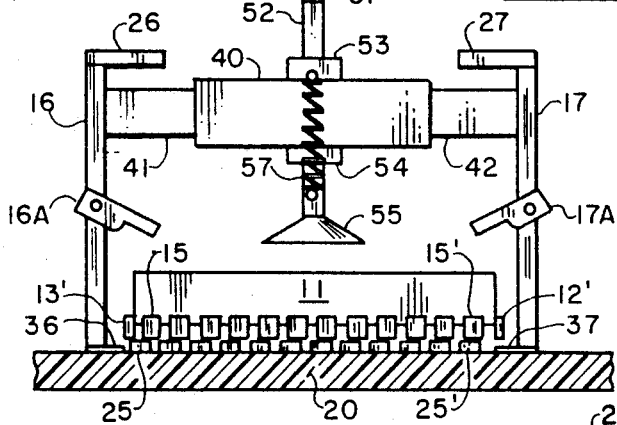
FIG. 6 is a sectional view of a repair tool in accordance with the present invention showing the tool positioned prior to component pickup.

With the tool properly adjusted for the component size and properly aligned relative to correct component mounting position utilizing the printed circuit board mounting pads and the magnified tool registration indicator arrows shown in image magnification sections 26 and 27, as may be seen in FIG. 5, proper positioning is facilitated and the next operation is ready. Once positioned, the vacuum component mechanism is actuated manually. Vacuum from vacuum source 50, through entry 51 and plunger mechanism 52 to vacuum cup 55, grasps the component such as 11. This vacuum operation lifts the component, such as 11, vertically upward from the printed circuit board, such as 20, as may be seen in FIGS. 5 and 6, causing the component 11 to engage the component centering cams 16A, 16B, 17A and 17B which automatically because of their configuration and location at right angles to each other, cause the component to be properly relocated relative to the tool reference system. As can be seen by references to FIGS. 6 and 7, once the component 11 has been seized and drawn upward by the plunger mechanism 52, cam locating centering cams 16A, 16B, 17A and 17B engage and cause component 11 to shift to the proper location from an improper location as may be seen in FIG. 6 to a position of proper alignment relative to the pads 25 through 25' on printed circuit board 20 as seen in FIG. 7.

Figure 7:
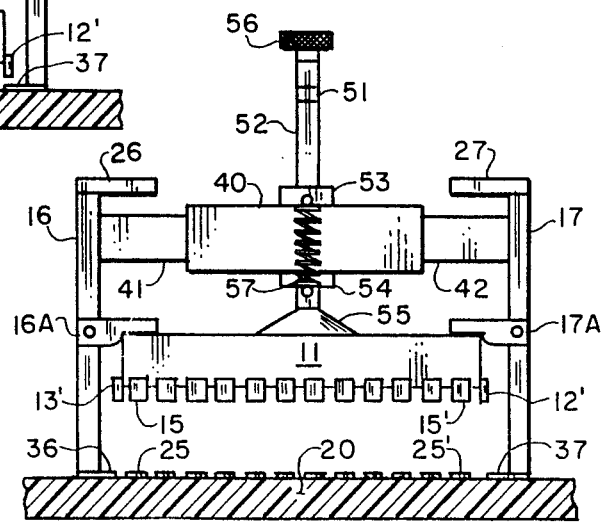
FIG. 7 is a sectional view of a repair tool in accordance with the present invention showing the repair tool and associated surface mounted component properly located in the centering cams after removal from a printed circuit board.

Once the tool reference system is correct relative to the printed circuit board mounting pads, such as 15 through 15' as seen in FIG. 7 and the component has been relocated relative to the tool, the component is now correctly located relative to the printed circuit board.

This is followed by reverse activation of the tool's mechanism which then positions the component back on the printed circuit board in the corrected position. The vacuum is then released and component repositioning has been accomplished. Since all component repositioning was accomplished with a vertical lift and replacement motion, no solder smearing or "snowplowing" occurs. As may be seen also since the tool repositioning has been held constant during the entire repositioning cycle, no subjective visual dexterity errors are introduced. The image magnification provided by sections 26 and 27 located on legs 16 and 17, respectively, permit the operator to precisely locate the tool relative to the component mounting pads on printed circuit board 20.

From the foregoing it will be obvious that the concept can be applied to any device, type, size and shape that uses surface mounting as a means of electrical attachment to printed circuit board assemblies. This repositioning techniques can be used manually as described or it could be incorporated in a fixed bed mechanism utilizing the same basic features. In the previous case, the tool is brought to the work, with the latter the work being brought to the tool. In both cases, the same concepts are employed, that is of registration (utilizing the printed circuit board mounting pads), followed by vertical lift with subsequent repositioning after realignment.

It will be obvious to those familiar with the art that numerous modifications may be made without departing from the spirit of the invention which should be limited only by the scope of the claims appended hereto.

What is claimed is:

1. A tool for use in repairing an improperly positioned surface mounted component on a printed circuit board, comprising:
   a horizontal body;
   a plurality of vertical members depending at right angles from said body;
   said members angularly positioned on said circuit board adjacent said component;
   locating means positioned on each of said members;
   a vertically movable vacuum plunger mounted on said body operated in a downward direction to engage said component followed by vertical motion of said plunger to move said engaged component upward into contact with said locating means;
   whereby said component is relocated relative to said printed circuit board;
   said plunger further operated to release said component thereby positioning said component in proper position on said printed circuit board.

2. A tool as claimed in claim 1, wherein:
   said body comprises a central section and two telescoping end sections.

3. A tool as claimed in claim 2, wherein:
   each end section includes a rack gear connected to at least one internally located pinion gear in said central section to facilitate lateral adjustment of said end section relative to said central section.

4. A tool as claimed in claim 2, wherein:
   each of said end sections further include adjustment markings indicative of proper positioning of said end sections relative to said component and said printed circuit board.

5. A tool as claimed in claim 1, wherein:
   said vertical members each comprise at least one vertical panel.

6. A tool as claimed in claim 1, wherein:
   each of said vertical members comprises a pair of vertical panels positioned at right angles each to the other.

7. A tool as claimed in claim 1, wherein:
   each of said vertical members further include magnifying means positioned thereon for viewing the position of said component.

8. A tool as claimed in claim 7, wherein:
   each of said magnifying means further include indicia facilitating proper location of said tool relative to said component on said printed circuit board.

9. A tool as claimed in claim 6, wherein:
   each of said panels include locator means to relocate said component relative to said printed circuit board in response to engagement of said locator means by said component.

10. A tool as claimed in claim 9, wherein:
    said locating means are cam shaped.

11. A tool as claimed in claim 1, wherein:
    said vacuum plunger is connected to an external vacuum source.

12. A tool as claimed in claim 11, wherein:
    said vacuum plunger further includes spring return means.

13. A tool as claimed in claim 1, wherein:
    vacuum plunger is initially operated manually in a downward direction to engage said component and automatically operated thereafter in a vertical motion to move said surface mounted component upward to engage said locator means.

14. A tool for use in repairing an improperly located surface mounted component on a printed circuit board comprising:
    a horizontally adjustable body including a central section and two telescoping end sections, each end section including rack gears connected to at least one internally located pinion gear of said central section, to facilitate lateral adjustment of said end sections relative to said central section;
    a vertical member depending at right angles to each of said end sections comprising at least one panel;
    each of said panels including at least two cam shaped locators positioned at right angles to each other;
    image magnification means positioned on the top of each of said vertical members and each including indicia markings thereon to facilitate proper positioning of said tool relative to said component at said printed circuit board location;
    a vertically movable vacuum plunger supported by the central portion of said body portion and including connection to an external vacuum source as well as connection to a spring return mechanism;
    downward operation of said plunger engaging said component;
    said vacuum plunger operated to seize said component and in response to said spring return mechanism said plunger moved in an upward direction disengaging said printed circuit board;
    said upward movement directing said component into engagement with said locators whereby said component is relocated relative to said printed circuit board;
    said vacuum plunger further operated to release said component thereby positioning said surface mounted component in proper position on said printed circuit board.

* * * * *